United States Patent

Del Gaudio

[15] 3,654,695

[45] Apr. 11, 1972

[54] METHOD OF MAKING AN ELECTRONIC MODULE

[72] Inventor: Italo Del Gaudio, Napoli, Italy

[73] Assignee: Texas Instruments Incorporated, Dallas, Tex.

[22] Filed: July 29, 1970

[21] Appl. No.: 59,232

[52] U.S. Cl. ..............................29/593, 29/624, 174/52 PE, 317/100

[51] Int. Cl. ..............................H05k 3/20

[58] Field of Search...............174/52 R, 52 PE, 68.5, DIG. 3; 317/100, 101 C, 101 CG; 29/624–627, 593; 264/272

[56] References Cited

UNITED STATES PATENTS 3,359,360 12/1967 Owings..............................174/52 PE 3,368,114 2/1968 Campbell..........................174/DIG. 3

3,522,490 8/1970 Kauffman..........................317/234 E

*Primary Examiner*—Darrell L. Clay

*Attorney*—Harold Levine, Edward J. Connors, Jr., John Haug and Gerald B. Epstein

[57] ABSTRACT

An electronic module is provided by positioning a plurality of metallic elements of interconnection in a desired pattern, attaching active and passive components to the elements of interconnection and encapsulating the elements and components in a thermally conductive, electrically insulative encapsulent. The encapsulent maintains the several parts of the module in a desired fixed spatial relationship with one another, as well as protecting and supporting parts of the module. The elements of interconnection are provided with terminal portions which project out of the encapsulent and some or all of the elements can be proportional to serve as heat sinks for the components.

3 Claims, 6 Drawing Figures

METHOD OF MAKING AN ELECTRONIC MODULE

The present invention relates to a system and method for making encapsuled electronic circuit units.

In the production of electronic circuits used to control medium and strong currents there are generally employed the following components:

a holder;

an assembly of electrical connection elements possibly obtained by means of printed circuits; a certain number of passive and active components, widely spaced or integrated or both;

elements for assisting the dissipation of the heat generated inside the components to the outside;

a protective case which fulfills also the functions of positioning, fastening, etc.

The object of the present invention is to provide a method in which elements of an electronic circuit for the electrical connection fulfill a function of support of the active and passive elements and of dissipation of the heat generated in these components.

Other objects and features will be in part apparent and in part pointed out hereinafter.

According to the present invention, there is provided an assembly of metallic elements of interconnection and support and dissipation of the heat on which are fastened the active and passive components of the electronic circuit, wherein at least part of the said elements of interconnection is provided with external connection terminals of the circuit. The elements are temporarily disposed on a support in predetermined spatial relationship with one another. The circuit is then tested and corrections made to conform the circuit to a predetermined standard. The complex of interconnecting elements and active and passive components is subsequently encapsuled in an electrically insulating plastic material which fulfills also the function of protection of the electronic circuit.

The invention accordingly comprises steps and sequence of steps, features of construction and manipulation, and arrangements of parts, all of which will be exemplified in the methods hereinafter described, and the scope of the application of which will be indicated in the following claims.

In the accompanying drawings, in which several of the various possible embodiments of the invention are illustrated:

Similar reference characters indicate corresponding parts throughout the several views of the drawings.

Figure 4:
FIG. 4 shows a side view of the complex of FIG. 3.
Figure 3:
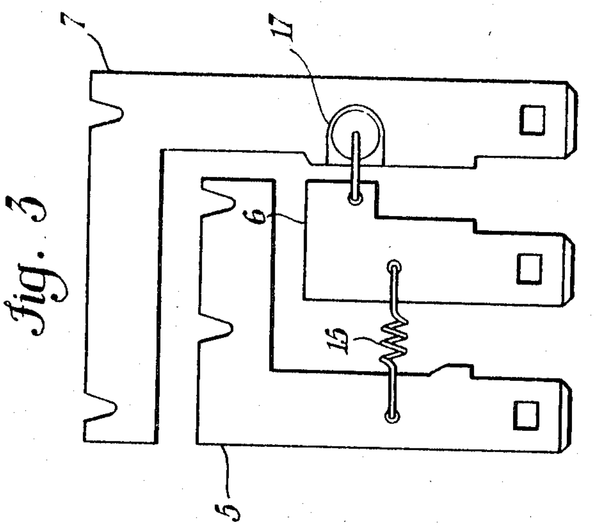
FIG. 3 shows a second group of elements of support and interconnection on which are mounted active and passive components.
Figure 2:
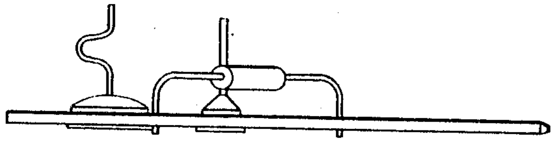
FIG. 2 shows a side view of the complex of FIG. 1.
Figure 1:
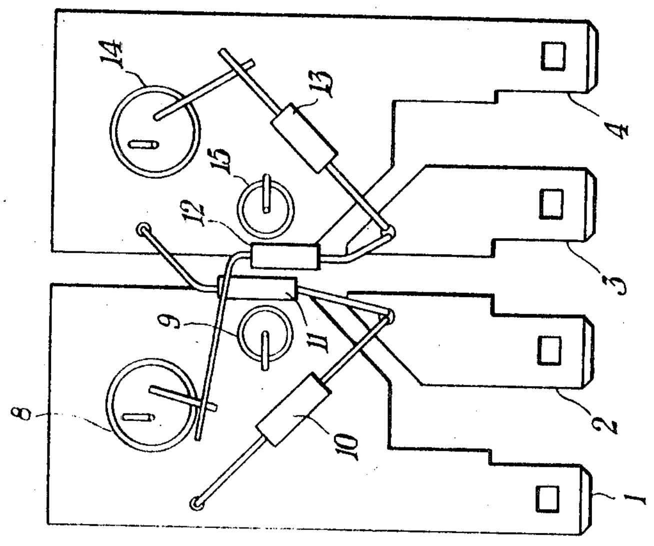
FIG. 1 shows a first group of elements of support and interconnection on which are mounted active and passive components.

Referring to the drawings, especially to FIGS. 1 through 4, the electronic circuit unit is obtained by mounting on elements of support and dissipation of the heat and interconnection 1, 2, 3, 4, 5, 6, 7 active and passive elements 10, 11, 12, 13, 14, 15, 16, 17 by welding, for example. The active elements can be formed by spaced apart or integrated semiconductor devices, wholly or partially in accordance with requirements. In this particular example, the elements of interconnection 1, 4, 7 serve likewise a thermal dissipators for semiconducting elements used to control strong currents, as the elements 8, 9, 14, 15 and 17. In the example shown in the figures, the aforementioned elements of interconnection are fitted with connecting terminal portions clearly visible in FIGS. 5 and 6.

There will now be described in brief the various phases of the process of fabrication of the encapsuled circuit units or modules.

On the elements of interconnection, 1 through 7 are directly attached various active components (e.g., transistor and gate controlled semiconductor devices) as in the form of regions or zones of a silicon element which define areas of connections or junctions and various passive components (e.g., resistors and capacitors). As mentioned previously, the elements of interconnection have their inherent and expected function of electrical connection but in addition perform the function of support and maintenance of the position of the components and of acting as a thermal dissipator when their mass and surface are appropriately proportioned.

After the operation is completed of attaching, as by welding, of the active and passive components, the elements of interconnection are placed on a support device or jig (not shown) as by placing the terminal portions in slots defined in the support device which assures the desired distances between the several elements.

The final mounting of the components and interconnecting of the said components is completed on the said supporting device on which can also be effected the approval tests of the circuit unit, and any repairs or corrections that may be required.

Figure 6:
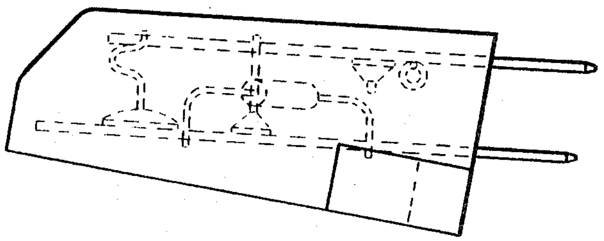
FIG. 6 shows the case or module of FIG. 6 in side view.
Figure 5:
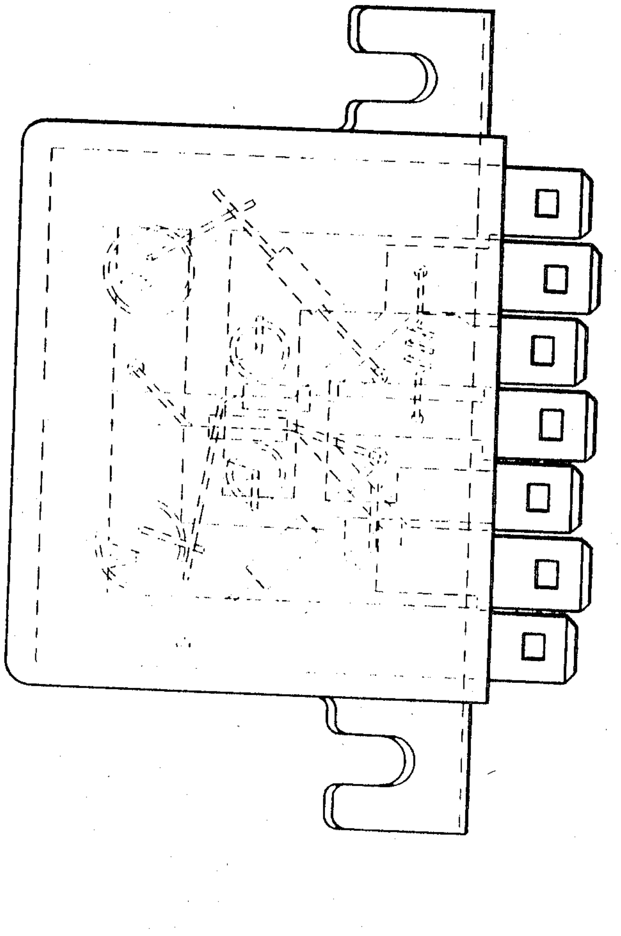
FIG. 5 shows the case or module comprising the electronic circuit unit in top view.

Then the insulating support carrying the unit is positioned in a die (not shown) which produces the final external form of the module constituting the circuit unit, as shown for example in FIGS. 5 and 6. Into the die can be injected or poured a resin which, when cured, displays the functions of a housing, a heat dissipator and a fastening system.

The so-obtained unit or module will consist of a rigid block of electrically insulating and thermally conducting material from which project the connection elements (FIGS. 5 and 6) with the loads, the power source, and possibly control circuits.

The elements of connection are not necessarily limited to the type shown, but can be of any conventional kind, such as screw or snap-in connections.

In view of the above, it will be seen that the several objects of the invention are achieved and other advantageous results attained.

It is to be understood that the invention is not limited in its application to the details of construction and arrangement of parts illustrated in the accompanying drawings, since the invention is capable of other embodiments and of being practiced or carried out in various ways. Also, it is to be understood that the phraseology or terminology employed herein is for the purpose of description and not of limitation.

As many changes could be made in the above constructions without departing from the scope of the invention, it is intended that all matter contained in the above description or shown in the accompanying drawings, shall be interpreted as illustrative and not in a limiting sense, and it is also intended that the appended claims shall cover all such equivalent variations as come within the true spirit and scope of the invention.

I claim:

1. A method for making electronic circuit units comprising the steps of prearranging an assembly of metallic elements of interconnection, thereafter fastening active and passive components of the electronic circuit to the elements of interconnection, after the components are fastened to the elements of interconnection temporarily disposing said elements on a support for supporting as well as determining the relative positioning of the said elements, thereafter placing the resulting complex, while still temporarily disposed on said support, in a die and placing an encapsulation of curable insulating material about the complex in the die so as to constitute the external housing for the said electronic circuit unit, curing the insulating material and removing the unit from the die and the support.

2. The method according to claim 1 including the step of proportioning at least some of the metallic elements so as to constitute thermal dissipators for the active and passive components mounted thereon.

3. The method according to claim 1 in which the support employed for temporarily supporting and positioning the elements of interconnection is electrically insulative and including, after the step of disposing said elements on said support but before the step of placing an encapsulation about the complex, the steps of energizing the circuit through the elements of interconnection and testing the active and passive components for compliance with a predetermined standard, and effecting appropriate corrections to make the circuit comply with the standard.

* * * * *